US012743781B2

(12) United States Patent
Cohen

(10) Patent No.: US 12,743,781 B2
(45) Date of Patent: Sep. 22, 2026

(54) SYSTEMS AND METHODS FOR MAGNETIC RESONANCE FINGERPRINTING WITH INCREASED VOLUMETRIC COVERAGE USING DEEP LEARNING RECONSTRUCTION

(71) Applicants: Memorial Sloan Kettering Cancer Center, New York, NY (US); Memorial Hospital for Cancer and Allied Diseases, New York, NY (US); Sloan-Kettering Institute for Cancer Research, New York, NY (US)

(72) Inventor: Ouri Cohen, New York, NY (US)

(73) Assignees: Memorial Sloan Kettering Cancer Center, New York, NY (US); Memorial Hospital for Cancer and Allied Diseases, New York, NY (US); Sloan Kettering Institute for Cancer Research, New York, NY (US)

( * ) Notice: Subject to any disclaimer, the term of this patent is extended or adjusted under 35 U.S.C. 154(b) by 267 days.

(21) Appl. No.: 18/725,626

(22) PCT Filed: Dec. 28, 2022

(86) PCT No.: PCT/US2022/054207

§ 371 (c)(1),
(2) Date: Jun. 28, 2024

(87) PCT Pub. No.: WO2023/129630

PCT Pub. Date: Jul. 6, 2023

(65) Prior Publication Data

US 2025/0069227 A1 Feb. 27, 2025

Related U.S. Application Data

(60) Provisional application No. 63/295,054, filed on Dec. 30, 2021.

(51) Int. Cl.
*A61B 5/055* (2006.01)
*G01R 33/483* (2006.01)
(Continued)

(52) U.S. Cl.
CPC ........ *G06T 7/0014* (2013.01); *G01R 33/4835* (2013.01); *G01R 33/5605* (2013.01);
(Continued)

(58) Field of Classification Search
CPC ......... G06T 7/0014; G06T 2207/10088; G06T 2207/30016; G06T 2207/30096;
(Continued)

(56) References Cited

U.S. PATENT DOCUMENTS

2015/0002149 A1 1/2015 Nehrke et al.
2016/0170002 A1 6/2016 Park et al.
(Continued)

FOREIGN PATENT DOCUMENTS

WO WO-2011/116229 A2 9/2011

OTHER PUBLICATIONS

Cohen et al: "Development of a Clinical Chemical Exchange Saturation G01R33/561 Transfer MR fingerprinting (CEST-MRF) A61B5/055 Pulse Sequence and Reconstruction for G16H30/20 Brain Tumor Quantification", G01R33/54 ARXIV, G06N3/06, Aug. 18, 2021.
(Continued)

*Primary Examiner* — Kent Yip
(74) *Attorney, Agent, or Firm* — Foley & Lardner LLP

(57) ABSTRACT

Presented herein are systems and methods for magnetic resonance fingerprinting with increased volumetric coverage using deep learning reconstruction. Fingerprinting techniques enable obtaining quantitative molecular information using a scanner in a non-invasive way. However, existing techniques for slice acquisition result in limited spatial
(Continued)

coverage. In a single size approach, the pulse sequence can include a full saturation train. The pulse saturation train can excite a single slice. After a delay to allow the magnetization to recover, the pulse saturation train excites the magnetization again with another saturation pulse with different saturation powers. The magnetization is repeated that over a certain length of acquisitions. The magnetization can generate the fingerprint from which to extract the underlying quantitative parameters. Instead of exciting a single slice and allowing it to recover, the present disclosure can excite multiple slices to increase the spatial coverage without increasing the scan time.

20 Claims, 7 Drawing Sheets

(51) Int. Cl.

*G01R 33/56* (2006.01)
*G06N 3/045* (2023.01)
*G06N 3/08* (2023.01)
*G06T 7/00* (2017.01)

(52) U.S. Cl.

CPC ......... *G01R 33/5608* (2013.01); *G06N 3/045* (2023.01); *G06N 3/08* (2013.01); *G06T 2207/10088* (2013.01); *G06T 2207/30016* (2013.01); *G06T 2207/30096* (2013.01)

(58) Field of Classification Search

CPC ............ G01R 33/4835; G01R 33/5605; G01R 33/5608; G01R 33/561; G06N 3/045; G06N 3/08; G06N 3/0475; G06N 3/0895; G16H 30/40; G16H 50/20; G16H 50/50; G16H 30/20; A61B 5/055; A61B 5/7264

See application file for complete search history.

(56) References Cited

U.S. PATENT DOCUMENTS

| | | | |
|---|---|---|---|
| 2016/0291107 | A1 | 10/2016 | Rosen et al. |
| 2017/0307706 | A1 | 10/2017 | Cloos et al. |
| 2018/0238983 | A1 | 8/2018 | Cohen |
| 2019/0362522 | A1 | 11/2019 | Han |

OTHER PUBLICATIONS

Cohen et al: "Fast CEST MR Fingerprinting with Increased Volumetric Coverage using Slice Permuted Acquisition and Deep Learning Reconstruction", Proceedings of the Joint Annual Meeting ISMRM-ESMRMB 2022 & ISMRT Annual Meeting, London, UK, May 7-12, 2022, ISMRM, 2030 Addison Street, 7th Floor, Berkeley, CA 94704 USA, No. 563, Apr. 22, 2022.

Cohen et al: "Optimized inversion-time schedules for quantitative T1 measurements based on high-resolution multi-inversion EPI", Magnetic Resonance in Medicine, vol. 79, No. 4, Apr. 27, 2018.

Cohen et al: "Quantitative multislice and jointly optimized rapid CEST for in vivo whole-brain imaging", Magnetic Resonance in Medicine, Wiley-Liss, US, vol. 94, No. 2, Mar. 14, 2025 (Mar. 14, 2025), pp. 541-553.

Golbabaee et al., "Geometry of Deep Learning for Magnetic Resonance Fingerprinting," ICASSP 2019—2019 IEEE International Conference on Acoustics, Speech and Signal Processing (ICASSP), retrieved on Mar. 16, 2023. Retrieved from <URL: https://ieeexplore.ieee.org/document/8683549> entire document.

International Search Report and Written Opinion for PCT/US22/54207 dated Apr. 6, 2023, 10 pages.

SYSTEMS AND METHODS FOR MAGNETIC RESONANCE FINGERPRINTING WITH INCREASED VOLUMETRIC COVERAGE USING DEEP LEARNING RECONSTRUCTION

REFERENCE TO RELATED APPLICATIONS

This application is a 371 U.S. National Phase Application of International Application No. PCT/US2022/054207, filed Dec. 28, 2022, which claims priority to and benefit of U.S. Provisional Patent Application No. 63/295,054 filed Dec. 30, 2021, the entirety of each of which is herein incorporated by reference.

BACKGROUND

A computing device may employ computer vision techniques to compare different images to one another. In comparing the images, the computing device may use any number of factors to perform the evaluation.

SUMMARY

At least one aspect of the present disclosure is directed a method for magnetic resonance fingerprinting with increased volumetric coverage using deep learning reconstruction. The method can include generating, by a computing system, a first sequence of a plurality of slices of a tissue sample. The method can include applying, by the computing system, a pulse of radio frequency energy to the first sequence of the plurality of slices to generate a first set of magnetized slices. The method can include generating, by the computing system, a second sequence of the plurality of slices. The method can include applying, by the computing system, the pulse of radio frequency energy to the second sequence of the plurality of slices to generate a second set of magnetized slices. The method can include generating, by the computing system, an image of the tissue sample by applying a first neural network to the first set of magnetized slices and a second neural network to the second set of magnetized slices.

In some implementations, the method can include generating, by the computing system, the second sequence of the plurality of slices by shifting a position of each slice in the first sequence of the plurality of slices by a predetermined amount.

In some implementations, the method can include generating, by the computing system, a comparison between the image of the tissue sample and a predetermined ground-truth value. The method can include identifying, by the computing system, an error of the image based on the comparison.

In some implementations, the method can include generating, by the computing system, the second sequence of the plurality of slices by modifying the first sequence of the plurality of slices based on the error.

In some implementations, the method can include receiving, by the computing system, the plurality of slices of the tissue sample from a histopathological image preparer or an imaging device. The method can include storing, by the computing system, in a database, the plurality of slices of the tissue sample.

In some implementations, the method can include modifying, by the computing system, the radio frequency energy provided by the pulse. The method can include applying, by the computing system, the modified pulse to the second sequence of the plurality of slices to generate the second set of magnetized slices having a first magnetization different than a second magnetization of the first set of magnetized slices.

In some implementations, the method can include applying, by the computing system, the pulse to the second sequence of the plurality of slices at a predetermined time subsequent to applying the pulse to the first sequence of the plurality of slices to generate the second set of magnetized slices having a first magnetization different than a second magnetization of the first set of magnetized slices.

In some implementations, the method can include maintaining, by the computing system, an acquisition schedule defining the predetermined time for obtaining subsequent sequences of the plurality of slices.

In some implementations, the method can include maintaining, by the computing system, the first neural network for the first set of magnetized slices by training the first neural network for the first set of magnetized slices. The method can include maintaining, by the computing system, the second neural network for the second set of magnetized slices by training the second neural network for the second set of magnetized slices.

In some implementations, the method can include storing, by the computing system, the image of the tissue sample in a database.

At least one aspect is directed to a system for magnetic resonance fingerprinting with increased volumetric coverage using deep learning reconstruction. A computing system can have one or more processors coupled with memory. The computing system can be configured to generate a first sequence of a plurality of slices of a tissue sample. The computing system can be configured to apply a pulse of radio frequency energy to the first sequence of the plurality of slices to generate a first set of magnetized slices. The computing system can be configured to generate a second sequence of the plurality of slices. The computing system can be configured to apply the pulse of radio frequency energy to the second sequence of the plurality of slices to generate a second set of magnetized slices. The computing system can be configured to generate an image of the tissue sample by applying a first neural network to the first set of magnetized slices and a second neural network to the second set of magnetized slices.

In some implementations, the computing system can be configured to generate the second sequence of the plurality of slices by shifting a position of each slice in the first sequence of the plurality of slices by a predetermined amount.

In some implementations, the computing system can be configured to generate a comparison between the image of the tissue sample and a predetermined ground-truth value. The computing system can be configured to identifying, by the computing system, an error of the image based on the comparison.

In some implementations, the computing system can be configured to generate the second sequence of the plurality of slices by modifying the first sequence of the plurality of slices based on the error.

In some implementations, the computing system can be configured to receive, the plurality of slices of the tissue sample from a histopathological image preparer or an imaging device. The computing system can be configured to store, in a database, the plurality of slices of the tissue sample.

In some implementations, the computing system can be configured to modify the radio frequency energy provided by the pulse. The computing system can apply the modified pulse to the second sequence of the plurality of slices to generate the second set of magnetized slices having a first magnetization different than a second magnetization of the first set of magnetized slices.

In some implementations, the computing system can be configured to apply the pulse to the second sequence of the plurality of slices at a predetermined time subsequent to applying the pulse to the first sequence of the plurality of slices to generate the second set of magnetized slices having a first magnetization different than a second magnetization of the first set of magnetized slices.

In some implementations, the computing system can be configured to maintain an acquisition schedule defining the predetermined time for obtaining subsequent sequences of the plurality of slices.

In some implementations, the computing system can be configured to maintain the first neural network for the first set of magnetized slices by training the first neural network for the first set of magnetized slices. The computing system can be configured to maintain the second neural network for the second set of magnetized slices by training the second neural network for the second set of magnetized slices.

In some implementations, the computing system can be configured to store the image of the tissue sample in a database.

BRIEF DESCRIPTION OF THE DRAWINGS

The foregoing and other objects, aspects, features, and advantages of the disclosure will become more apparent and better understood by referring to the following description taken in conjunction with the accompanying drawings, in which.

DETAILED DESCRIPTION

Following below are more detailed descriptions of various concepts related to, and embodiments of, systems and methods for magnetic resonance fingerprinting with increased volumetric coverage using deep learning reconstruction. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Section A describes systems and methods for magnetic resonance fingerprinting with increased volumetric coverage using deep learning reconstruction.

Section B describes fast CEST MR fingerprinting with increased volumetric coverage using deep learning reconstruction.

Section C describes a network environment and computing environment which may be useful for practicing various embodiments described herein.

A. Systems and Methods for Magnetic Resonance Fingerprinting with Increased Volumetric Coverage Using Deep Learning Reconstruction Fingerprinting techniques enable obtaining quantitative molecular information using a scanner in a non-invasive way. However, existing techniques for slice acquisition result in limited spatial coverage. Chemical Exchange Saturation Transfer (CEST) imaging for cancer can differentiate true progression from pseudo-progression in brain tumors. CEST can suffer from a qualitative signal, long scan times, and complicated analysis that is difficult for clinical adoption. In a single slice approach, the pulse sequence can include a full saturation train. The pulse saturation train can excite a single slice. After a delay to allow the magnetization to recover, the pulse saturation train excites the magnetization again with another saturation pulse with different saturation powers. The magnetization is repeated over a certain length of acquisitions. The magnetization can generate the fingerprint from which to extract the underlying quantitative parameters. Instead of exciting a single slice and allowing it to recover, the present disclosure can excite multiple sets of slices at the same time to increase the spatial coverage without increasing the scan time. The systems and methods described herein can vary the excitation sequence of each set of slices so that each slice undergoes a unique magnetization from the excitation. For example, the excitation can be applied to slices 1, 2, 3, and then 4. A subsequent excitation can be applied to slices 3, 4, 1, and then 2. The time between excitations, the intensity of the excitation, and the slice sequences can be modified to optimize the excitation and magnetization of the slices. The systems and methods described herein can reconstruct the images from the magnetized slices by using deep learning neural networks to enable volumetric coverage without the need for additional scan time.

Figure 1:
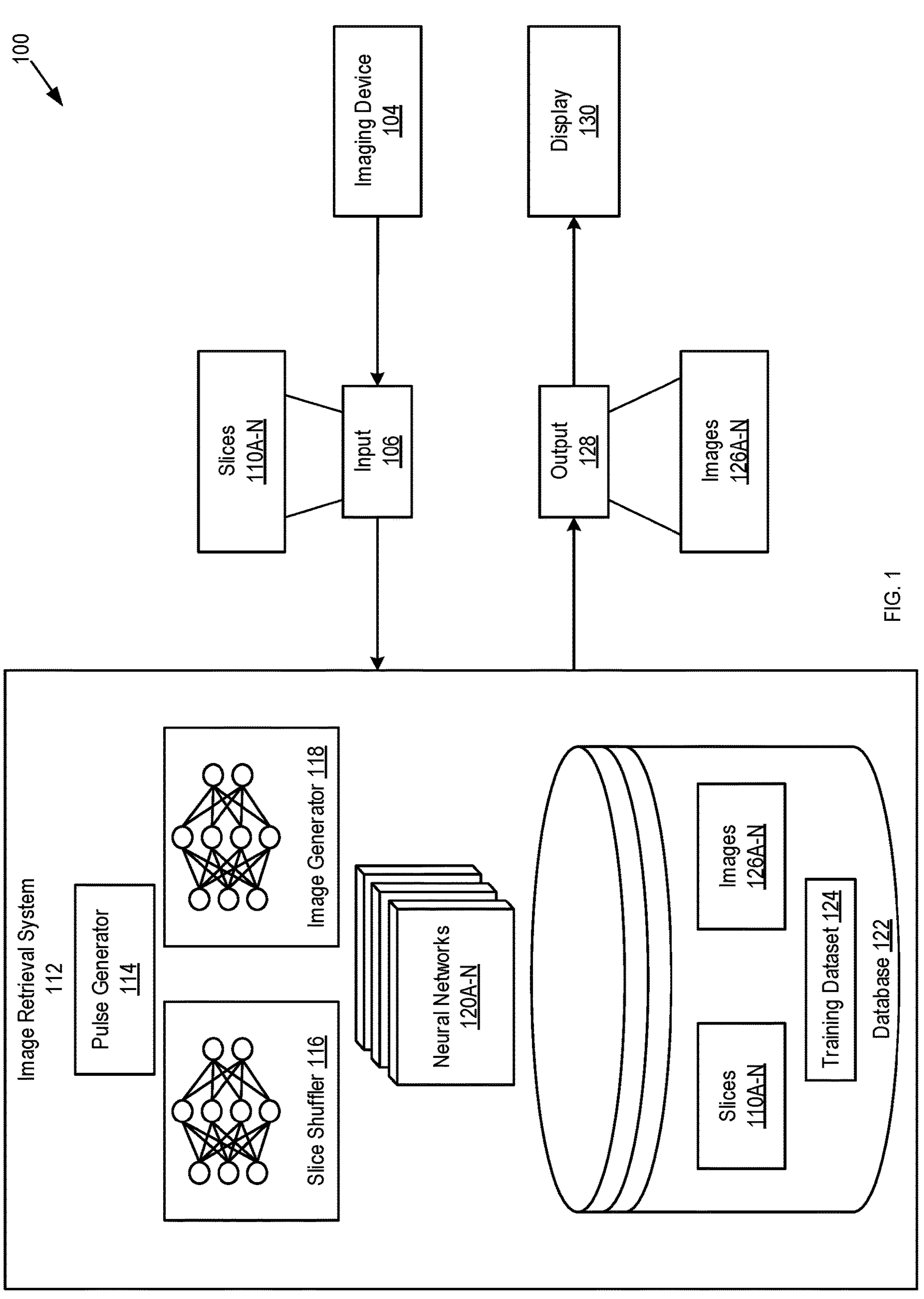
FIG. 1 depicts a block diagram of a system for magnetic resonance fingerprinting with increased volumetric coverage using deep learning reconstruction.

Referring now to FIG. 1, depicted is a block diagram of a system 100 for magnetic resonance fingerprinting with increased volumetric coverage using deep learning reconstruction. In brief overview, the system 100 may include at least one image retrieval system 112 (sometimes generally referred to as a computing system), at least one imaging device 104, and at least one display 130, among others. The imaging device 104, the image retrieval system 112, and the display 130 can be communicatively coupled to one another. The image retrieval system 112 can include at least one input 106 for receiving a plurality of slices 110A-N (hereinafter generally referred to as slice 110). The image retrieval system 112 can include at least one pulse generator 114, at least one slice shuffler 116, at least one image generator 118, a plurality of neural networks 120A-N (hereinafter generally referred to as neural networks 120), at least one database 122, and at least one output 128, among others. The database 122 can include the slices 110A-N, at least one training dataset 124, and a plurality of images 126A-N (hereinafter generally referred to as images 126), among others. Each of the components in the system 100 listed above may be implemented using hardware (e.g., one or more processors coupled with memory) or a combination of hardware and software as detailed herein in Section C. Each of the components in the system 100 may implement or execute the functionalities detailed herein, such as those described in Sections A or B.

Figure 2:
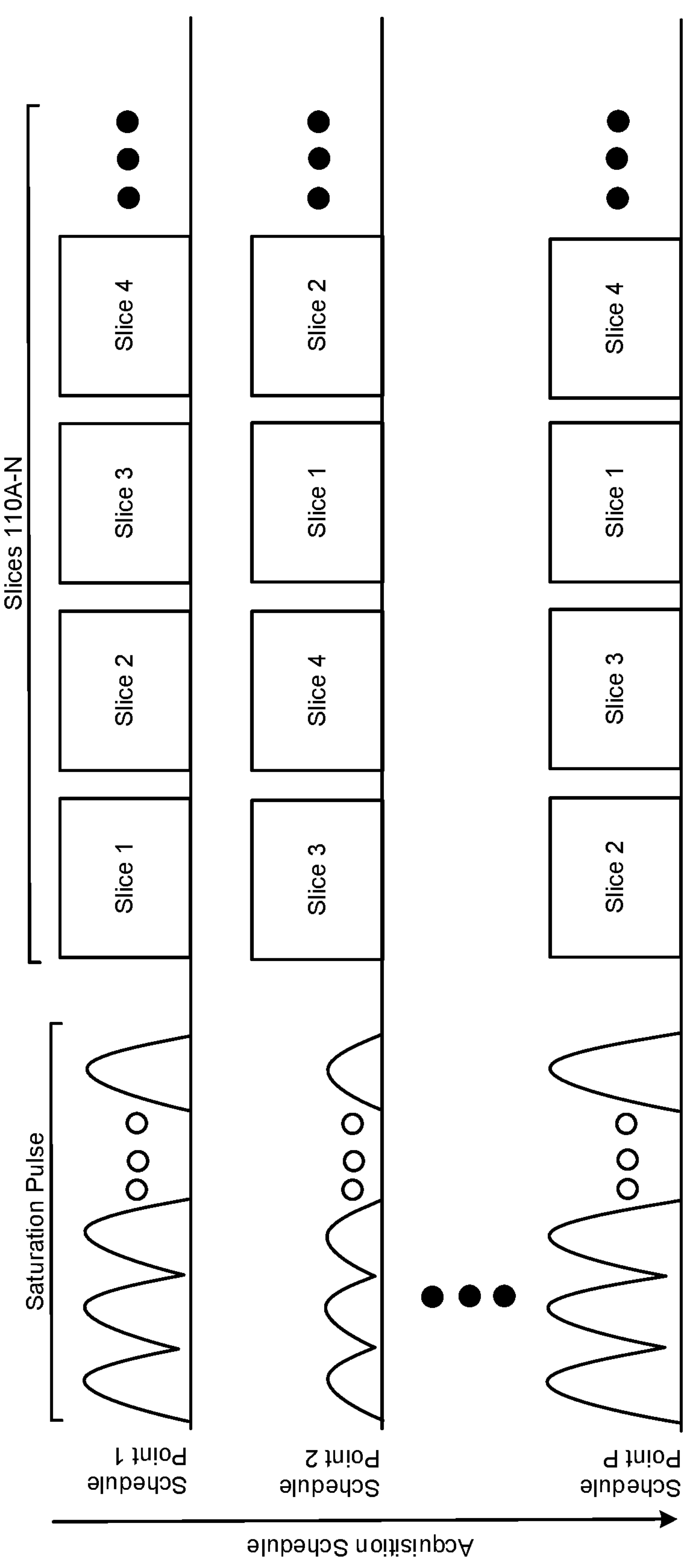
FIG. 2 depicts an example pulse sequence diagram for the msCEST-MRF sequence.

Now referring to FIG. 1 in conjunction with FIG. 2, FIG. 2 depicts a pulse sequence diagram for the msCEST-MRF sequence. The pulse generator 114 can generate a pulse with radio frequency energy and apply the pulse to each of the slices 110. The pulse generator 114 can generate magnetization that is saturated by the pulse centered on the amide protons. For example, the pulse generator 114 can generate a Gaussian-shaped saturation pulse train centered on the amide proton frequency (3.5 ppm). The pulse generator 114 can generate each pulse of radio frequency energy followed by excitation of N slices 110 whose order of excitation is permuted for each time point.

The pulse generator 114 can apply a variety of pulse to the slices 110 to analyze a variety of magnetized slices 110. The pulse generator 114 can generate a pulse with an acceleration factor. For example, an acceleration factor of R=3 with partial Fourier can be used to enable a spatial resolution of $1.2\times1.2\times3$ $mm^3$ to ensure that small lesions can be resolved. The pulse generator 114 can select a simultaneous multi-slice acceleration factor. For example, the pulse generator 114 can select a simultaneous multi-slice acceleration factor of S=2 to both reduce scan time and facilitate the slice ordering optimization. The pulse generator 114 can select any repetition time (TR), excitation flip angle (FA), and saturation duration (Tsat). For example, the pulse generator 114 can select a TR, FA, and Tsat as follows: TR=3500 ms, FA=90°, Tsat=2560 ms. The pulse generator 114 can identify or receive the signal from each slice 110 after applying the pulse. The pulse generator 114 can maintain an EPI readout with any partial Fourier factors, acceleration factor, and an echo time (TE). For example, the pulse generator 114 can identify or acquire the signal from each slice 110 with an EPI readout with partial Fourier factor of −6/8, acceleration factor R=2, and an TE of 24 ms. The pulse generator 114 can acquire the signal from any matrix size and field of view (FOV) for any in plane resolution and slice thickness. For example, the matrix size was 224×224 with a FOV of 280 mm2 for an in plane resolution of 1.25 mm2 and a slice thickness of 5 mm. The pulse generator 114 can obtain each slice 110 in a small amount of time for a small total acquisition time (e.g., less than 2 minutes). For example, the pulse generator 114 can obtain of each slice 110 in −64 ms and the total acquisition time for the 30 schedule time steps used can be 105 seconds.

For example, the pulse generator 114 can generate a pulse for acquisition of the plurality of slices 110. The model can generate a first order of the plurality of slices 110. The pulse generator 114 can generate a pulse with a specific power. The specific power can be the saturation power. The pulse generator 114 can select the specific power based on a predetermined acquisition parameter. The pulse generator 114 can apply the pulse at a first time point (e.g., schedule point 1) during a single repetition time.

As the distance from the saturation increases, the signal decays so the later slices 110 will have decayed magnetization. Instead of repeating the entire acquisition with each slice 110 and thus multiply the acquisition time by a factor of n where n is the number of slices 110, the slice shuffler 116 can modify the order of the slices 110 for each slice acquisitions. Based on the modification of the orders, the slice shuffler 116 applies, to each slice 110, unique signal based on the slice 110 and the order in which it was acquired. By modifying the sequence of the slices 110, the slice shuffler 116 enables each slice 110 to have an independent signal evolution.

The pulse generator 114 can obtain an acquisition by generating a scan at scheduled time points. For example, the scheduled time points can be every four seconds. In another example, the schedule time points can be four and a half seconds per time point. In another example, the scheduled time points can be every three seconds. The pulse generator 114 can modify the scheduled time points to optimize discrimination between signals. The pulse generator 114 can increase the repetition time to excite more slices 110. For example, the pulse generator 114 can increase the repetition time by 500 milliseconds per time point. The pulse generator 114 can take 64 milliseconds for the acquisition of each slice 110. With an additional 500 milliseconds, the model can obtain approximately 9 additional slices 110. Such an increase can increase the total scan time by a small amount. For example, the increase can increase total scan time by 30 seconds.

At the second time point (e.g., schedule point 2), the slice shuffler 116 can generate a second sequence of the plurality of slices 110. The second sequence of the plurality of slices 110 can be different from the first sequence of the plurality of slices 110. For example, the slice shuffler 116 can generate the sequence of the plurality of slices 110 by using a skip three circular shift ordering. In another example, the slice shuffler 116 can generate the sequence based on a metric or optimization. The metric can be based on tissue discrimination or error. The model can identify or generate the metric based on the tissue discrimination or error. By identifying the metric, the model can minimize the error between the true tissue values and the constructed tissue values. For example, the slice shuffler 116 can reorder or shuffle the slices 110 by optimizing the signal. The slice shuffler 116 can identify a slice sequence that optimizes the signal. By optimizing the signal, the image generator 118 can generate differences or artifacts to improve the discrimination between different tissues. The slice shuffler 116 can identify the slice sequence based on the signal. The slice shuffler 116 can identify the signal based on the signal as the signal changes depending on the slice 110 and tissue.

At the second time point, the pulse generator 114 can apply the pulse to the second sequence of the plurality of slices 110. The slice shuffler 116 can continue generating different sequence of the plurality of slices 110 and applying the pulse to each sequence until the schedule is complete. For example, the pulse generator 114 can continue for a two minute acquisition using a four second repetition time. By reordering the plurality of slices 110, the pulse generator 114 can apply a different magnetization to each slice 110 at each time point because the position of each slice 110 is shifted in the sequence. For example as shown in FIG. 2, at the first time point, the pulse generator 114 can apply a pulse to slice 1 before the other slices 110 for slice 1 to have a first signal intensity or magnetization. At the second time point, the pulse generator 114 applies the pulse to slice 1 after the other slices 110 for slice 1 to have second signal intensity that is smaller than the first signal intensity. By reordering the slices 110, the pulse generator 114 causes each physical or anatomical slice 110 to have a unique signal intensity at each time point.

The pulse generator 114 can optimize the acquisition parameters for each acquisition of slices 110. The pulse generator 114 can modify the saturation power for exciting the plurality of slices 110. For example, the pulse generator 114 can modify the pulse power that's used for each time point. In some implementations, the model be combined with simultaneous multi-slice methods to increase slice coverage. Combining the best sequence of simultaneous multi-slices can multiply the spatial coverage and simplify the slice ordering optimization and the reconstruction. The simultaneous multi-slice excitation can increase spatial coverage without increasing scan time.

While the images 126 can be reconstructed by matching the measured signal to a dictionary of simulated signals that encompass the entire space of parameters, such reconstruction can be limited in images associated with chemical exchange or saturation with many parameters that cause the dictionary to grow exponentially. The image generator 118 advantageously uses neural networks 120 to reconstruct or generate the image 126 of the tissue sample from each of the magnetized or excited slices 110. In some implementations, the image generator 118 can maintain or train a neural network 120 for each respective slice 110. For example, the image generator 118 can generate or reconstruct the image 126 of the tissue sample by applying a first neural network 120A to the first set of magnetized slices 110A and a second neural network 120B to the second set of magnetized slices 110B. In some implementations, the image generator 118 can maintain or train a neural network 120 for all of the slices 110. For example, the image generator 118 can generate or reconstruct the image 126 of the tissue sample by applying a neural network 120 to the first set of magnetized slices 110A and the second set of magnetized slices 110B.

Figure 3:
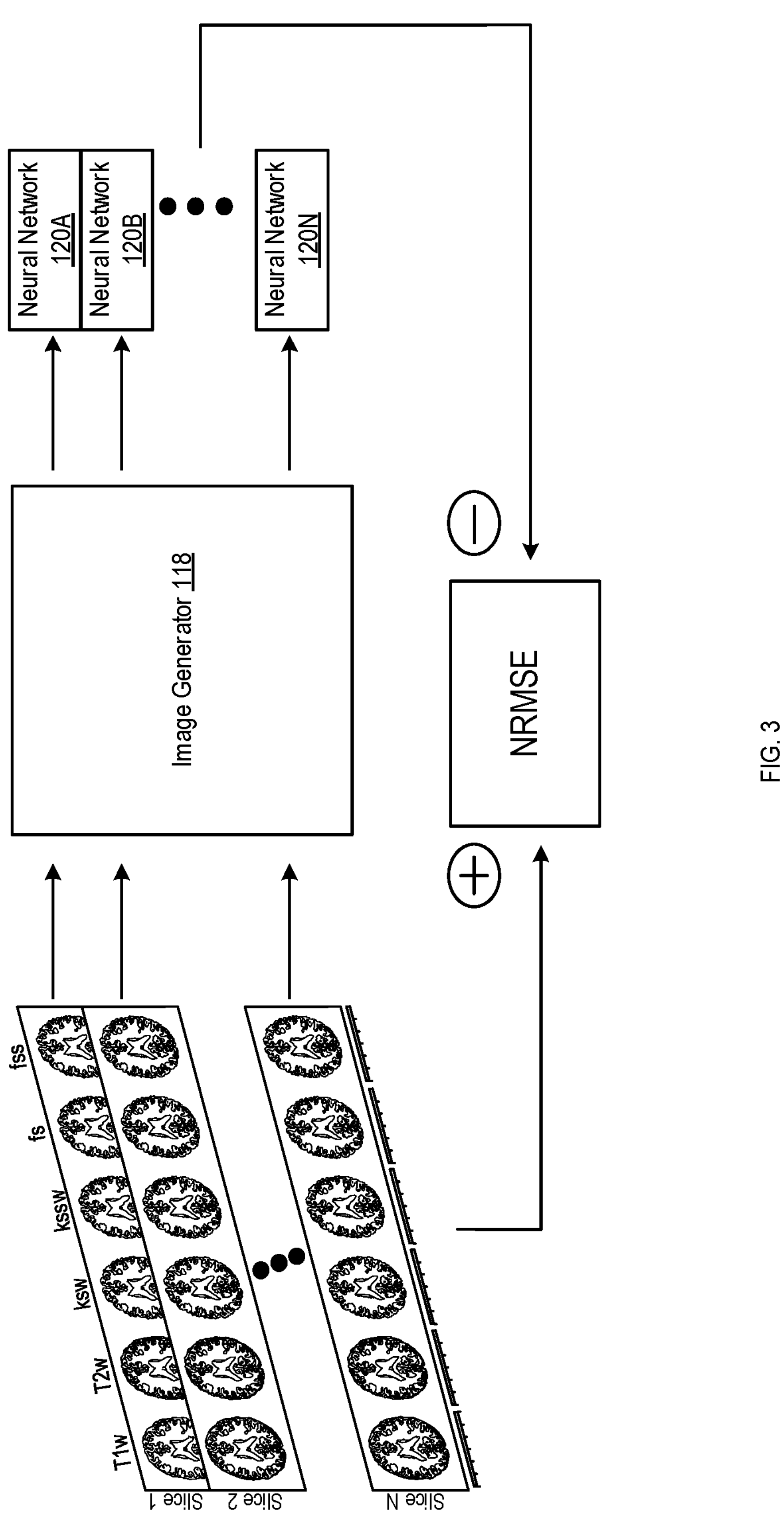
FIG. 3 depicts example numerical simulations of the msCEST-MRF.

Now referring to FIG. 3 in conjunction with FIG. 1, FIG. 3 depicts an illustration of numerical simulations of the msCEST-MRF accuracy. The image generator 118 can use a customized volumetric brain phantom to simulate an msCEST-MRF acquisition. The same anatomical slice 110 can be used to simulate the acquisition of all slices 110 to eliminate any confounds due to the anatomy. The image generator 118 can quantify the tissue parameters in each slice 110 with a trained neural network 120 corresponding to each respective slice 110. The image generator 118 can compare the output to ground-truth values.

The image generator 118 can use or train the neural networks 120 to reconstruct the images 126. The neural networks 120 may be an instance of the architecture detailed herein in conjunction with Section A. The configuration of the neural networks 120 may be in accordance with a generative adversarial network (GAN), a variational autoencoder, or other unsupervised or semi-supervised model, among others. Each of the neural networks 120 can have at least one input 106 and at least one output 130. The input 106 to the neural networks 120 may correspond to the inputs 106 of the image generator 118. The input 106 to the neural networks 120 (or corresponding random noise distribution vectors) can be processed one-by-one by the image generator 118.

The image generator 118 can generate the images 126 by obtaining the tissue parameters of each of the slices 110. The image generator 118 can train a neural network 120 for each individual slice 110. For example, each neural network 120 can be associated with each slice 110 that has a different signal evolution. The image generator 118 can train the neural network 120 on a dataset customized for each slice 110. The image generator 118 can advantageously include the plurality of neural networks 120 for training from each individual slice 110.

The input 106 of the neural networks 120 can include the training dataset 124. The training dataset 124 may be generated using a pseudo-random number generator. The image generator 118 can define a training dataset 124 for each sequence of slices 110. For example, the image generator 118 can identify a unique sequence of slices 110 for each slice 110 to define a training dataset 124 for each slice 110. The image generator 118 can use each training dataset 124 to train a respective neural network 120 for reconstructing a respective slice 110.

The output of the neural networks 120 can include the images 126 (or test images or feature space representations) corresponding to the input 106. The output 130 of one neural network 120 may be fed into the input of another neural network 120. The output 130 can include a resultant. The input 106 and the output 130 may be related to each other via a set of weights (sometimes referred herein as parameters, kernel parameters, or neural parameters) to be applied to the input 106 to generate the output 130. In some embodiments, the set of weights may be arranged in one or more transform layers. Each layer may specify a combination or a sequence of application of the weights. The layers may be arranged in accordance with the machine learning algorithm or model for the neural networks 120.

The model can use the plurality of neural networks 120 to map and obtain a plurality of parameters for multiple slices 110 at the same time. The model can combine deep learning reconstruction to use the plurality of neural networks 120. Without the plurality of neural networks 120, the scan length would increase as the number of slices 110 increased. Based on the plurality of parameters, the model can reconstruct or generate the underlying tissue parameters from all the slices 110. By using the plurality of neural networks 120, the model can reconstruct the tissue parameters to increase spatial coverage without increasing scan length. The image generator 118 advantageously uses the neural networks 120 such that the reconstruction is instantaneous subsequent to training the network and requires few computational resources. For example, the image generator 118 or the image retrieval system 112 in its entirety can be incorporated into an MRI scanner and reconstruct the images 126 on the scanner obtaining the slices 110.

The image generator 118 can provide the images 126 via the output 130 to a requesting device (e.g., the imaging device 104) for presentation (e.g., via the display 130). The image generator 118 can send, transmit, or provide at least one output 130 for presentation to the display 130. The output 130 may include the selected images 126. The display 130 may be part of the image retrieval system 112 or on another computing device that may be communicatively coupled to the image retrieval system 112. The display 130 may present or render the output 130 upon receipt. For example, the display 130 may render a graphical user interface that shows the selected images 126.

Figures 4A, 4B:
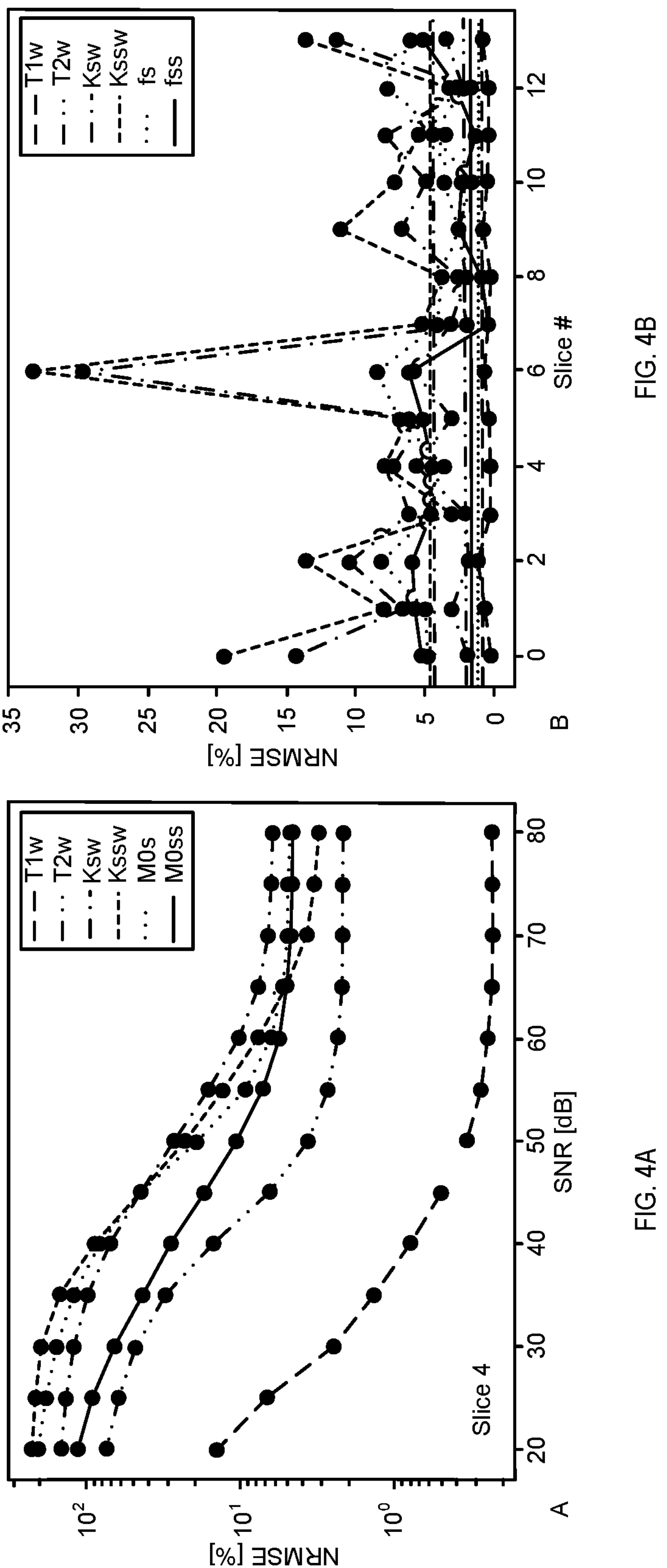
FIGS. 4A and 4B depicts normalized root-mean-square error (NRMSE) for multiple slices.

Now referring to FIGS. 4A and 4B in conjunction with FIG. 1, FIGS. 4A and 4B depicts a characterization of the resulting error for a slice ordering. In particular, FIGS. 4A and 4B depicts a normalized root-mean-square error (NRMSE) of each tissue parameter on a log scale. FIG. 4A depicts NRMSE of each parameter for a single slice 110 with varying levels of injected Gaussian white noise. FIG. 4B depicts NRMSE of each parameter for all 14 slices 110. The dashed colored lines indicate the NRMSE of each tissue parameter for an equivalent single slice CEST-MRF sequence. For some parameters and slices 110, the msCEST-MRF error was below that of the single slice 110 CEST-MRF despite the 14-fold larger spatial coverage. By modifying the sequences of the slices 110 based on the metrics, the slice shuffler 116 can reduce the error.

Figure 5:
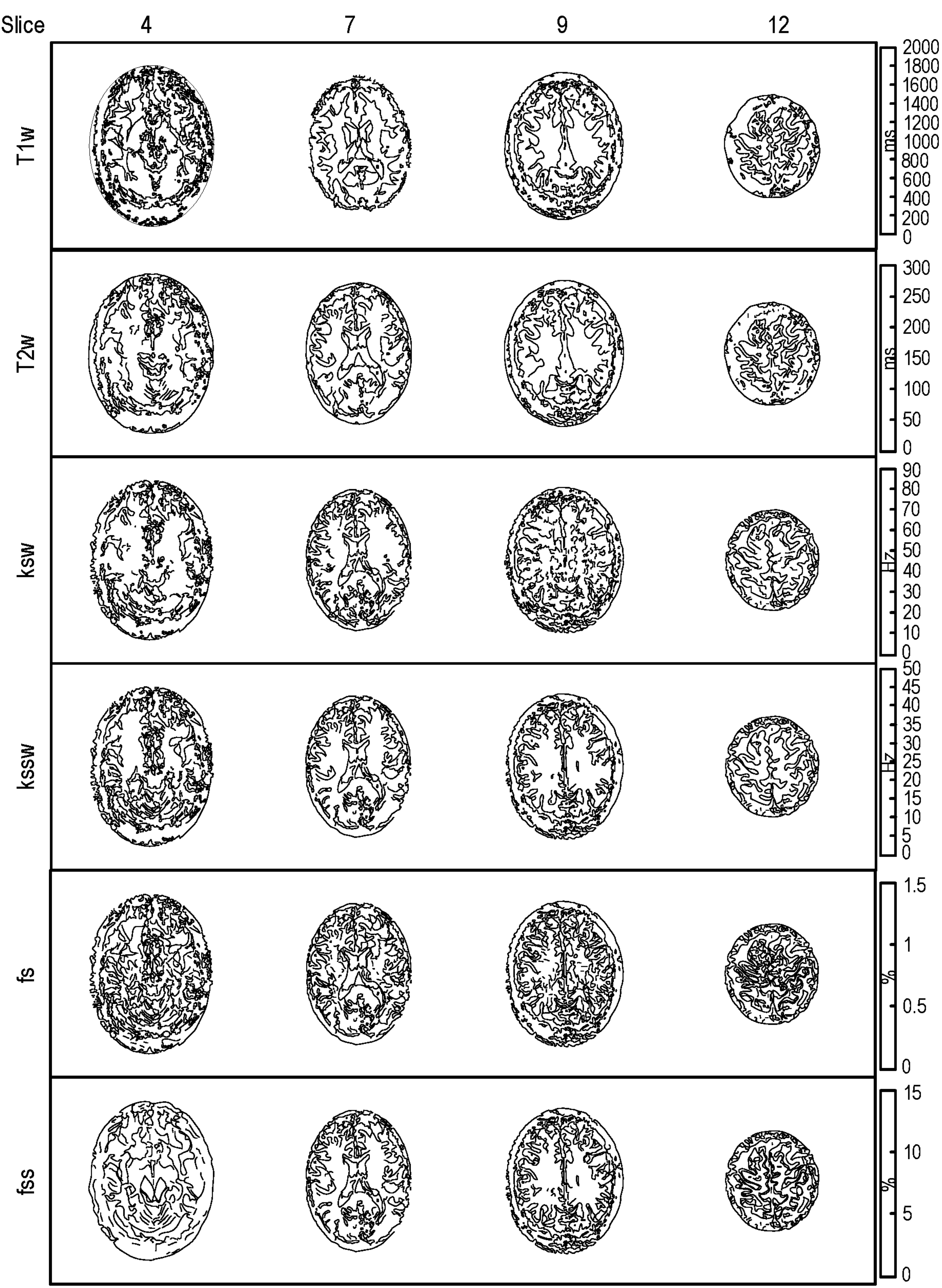
FIG. 5 depicts a subset of reconstructed tissue parameters from an in vivo healthy subject imaged with the msCEST-MRF pulse sequence.

Now referring to FIG. 5 in conjunction with FIG. 1, FIG. 5 depicts an example vivo acquisition of 14 slices 110. In particular, FIG. 5 depicts a subset of reconstructed tissue parameters from an in vivo healthy subject imaged with the msCEST-MRF pulse sequence. The total scan time to acquire all 14 slices 110 was 105 seconds, same as a single-slice sequence but with a wider spatial coverage. Although T1w and T2w were underestimated, the remaining CEST parameters were within the expected ranges. FIG. 5 demonstrates that the image generator 118 can successfully acquire data from the sequence of the plurality of slices 110 and reconstruct it into images 126.

Figure 6:
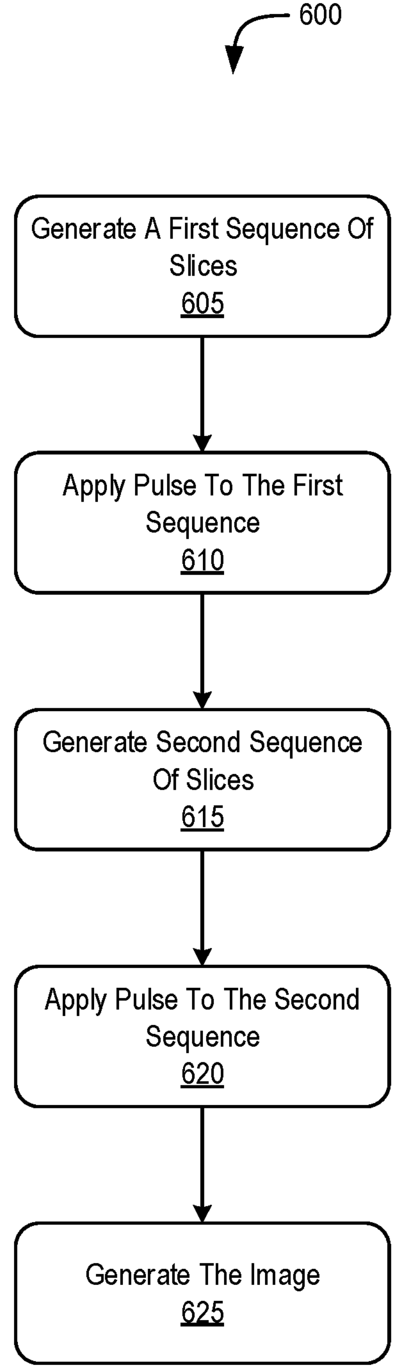
FIG. 6 depicts a flow diagram of a method for magnetic resonance fingerprinting with increased volumetric coverage using deep learning reconstruction.

FIG. 6 depicts a flow diagram of a method of training models for magnetic resonance fingerprinting with increased volumetric coverage using deep learning reconstruction. The method 600 may be implemented or performed by any of the components described herein in conjunction with FIGS. 1-5 or FIG. 7. In overview, a computing system (e.g., the image retrieval system 112) can generate a first sequence of slices (e.g., slices 110) (605). The computing system may apply a pulse the first sequence of slices (610). The computing system can generate a second sequence of slices (615). The computing system can apply the pulse to the second sequence of the slices (620). The computing system can generate an image (e.g., image 126) of the tissue sample (625).

The computing system can generate a first sequence of slices (e.g., slices 110) (605). Now referring to FIG. 2 in conjunction with FIG. 6, FIG. 2 depicts a pulse sequence diagram for the msCEST-MRF sequence. The computing system can generate a pulse and apply the pulse to each of the slices. The computing system can generate magnetization that is saturated by a pulse centered on the amide protons. For example, the computing system can generate a Gaussian-shaped saturation pulse train centered on the amide proton frequency (3.5 ppm). The computing system can generate each pulse of radio frequency energy followed by excitation of N slices whose order of excitation is permuted for each time point.

The computing system can apply a variety of pulses to the slices to analyze a variety of magnetized slices. The computing system can generate a pulse with an acceleration factor. For example, an acceleration factor of R=3 with partial Fourier can be used to enable a spatial resolution of $1.2\times1.2\times3$ $mm^3$ to ensure that small lesions can be resolved. The computing system can select a simultaneous multi-slice acceleration factor. For example, the computing system can select simultaneous multi-slice acceleration factor of S=2 to both reduce scan time and facilitate the slice ordering optimization. The computing system can select any repetition time (TR), excitation flip angle (FA) and saturation duration (Tsat) were as follows: TR=3500 ms, FA=90°, Tsat=2560 ms. The computing system can identify or receive the signal from each slice after applying the pulse. The computing system can maintain an EPI readout with any partial Fourier factors, acceleration factor, and an echo time (TE). For example, the computing system can identify or acquire the signal from each slice was read with an EPI readout with partial Fourier factor of −6/8, acceleration factor R=2, and an TE of 24 ms. The computing system can acquire the signal from any matrix size and field of view (FOV) for any in plane resolution and slice thickness. For example, matrix size was 224×224 with a FOV of 280 mm2 for an in-plane resolution of 1.25 mm2 and a slice thickness of 5 mm. The computing system can obtain each slice in a small amount of time for a small total acquisition time (e.g., less than 2 minutes). For example, the computing system can obtain of each slice in −64 ms and the total acquisition time for the 30 schedule time steps used can be 105 seconds.

The computing system may apply a pulse to the first sequence of slices (610). For example, the computing system can generate a pulse for acquisition of the plurality of slices. The model can generate a first order of the plurality of slices. The computing system can generate a pulse with a specific power. The specific power can be the saturation power. The computing system can select the specific power based on a predetermined acquisition parameter. The computing system can apply the pulse at a first time point (e.g., schedule point 1) during a single repetition time.

The computing system can generate a second sequence of slices (615). As the distance from the saturation increases, the signal decays so the later slices will have decayed magnetization. Instead of repeating the entire acquisition with each slice and thus multiply the acquisition time by a factor of n where n is the number of slices, the computing system can modify the order of the slices for each slice acquisitions. Based on the modification of the orders, the computing system applies, to each slice, unique signal based on the slice and the order in which it was acquired. By modifying the sequence of the slices, the computing system enables each slice to have an independent signal evolution.

The computing system can apply the pulse to the second sequence of the slices (620). The computing system can obtain an acquisition by generating a scan at scheduled time points. For example, the scheduled time points can be every four seconds. In another example, the schedule time points can be four and a half seconds per time point. In another example, the scheduled time points can be every three seconds. The computing system can modify the scheduled time points to optimize discrimination between signals. The computing system can increase the repetition time to excite more slices. For example, the computing system can increase the repetition time by 500 milliseconds per time point. The computing system can take 64 milliseconds for the acquisition of each slice. With an additional 500 milliseconds, the model can obtain approximately 9 additional slices. Such an increase can increase the total scan time by a small amount. For example, the increase can increase total scan time by 30 seconds.

At the second time point (e.g., schedule point 2), the computing system can generate a second sequence of the plurality of slices. The second sequence of the plurality of slices can be different from the first sequence of the plurality of slices. For example, the computing system can generate the sequence of the plurality of slices by using a skip three circular shift ordering. In another example, the computing system can generate the sequence based on a metric or optimization. The metric can be based on tissue discrimination or error. The model can identify or generate the metric based on the tissue discrimination or error. By identifying the metric, the model can minimize the error between the true tissue values and the constructed tissue values. For example, the computing system can reorder or shuffle the slices by optimizing the signal. The computing system can identify a slice sequence that optimizes the signal. By optimizing the signal, the computing system can generate differences or artifacts to improve the discrimination between different tissues. The computing system can identify the slice sequence based on the signal. The computing system can identify the signal based on the signal as the signal changes depending on the slice and tissue.

At the second time point, the computing system can apply the pulse to the second sequence of the plurality of slices. The computing system can continue generating different sequence of the plurality of slices and applying the pulse to each sequence until the schedule is complete. For example, the computing system can continue for a two minute acquisition using a four second repetition time. By reordering the plurality of slices, the computing system can apply a different magnetization to each slice at each time point because the position of each slice 110 is shifted in the sequence. For example as shown in FIG. 2, at the first time point, the computing system can apply a pulse to slice 1 before the other slices for slice 1 to have a first signal intensity or magnetization. At the second time point, the computing system applies the pulse to slice 1 after the other slices for slice 1 to have second signal intensity or magnetization that is smaller than the first signal intensity or magnetization. By reordering the slices, the computing system causes each physical or anatomical slice to have a unique signal intensity or magnetization at each time point.

The computing system can optimize the acquisition parameters for each acquisition of slices. The computing system can modify the saturation power for exciting the plurality of slices. For example, the computing system can modify the power or radio frequency energy emitted by the pulse at each time point. In some implementations, the model be combined with simultaneous multi-slice methods to increase slice coverage. Combining the best sequence of simultaneous multi-slices can multiply the spatial coverage and simplify the slice ordering optimization and the reconstruction. The simultaneous multi-slice excitation can increase spatial coverage without increasing scan time.

The computing system can generate an image of the tissue sample (625). While the images can be reconstructed by matching the measured signal to a dictionary of simulated signals that encompass the entire space of parameters, such reconstruction can be limited in images that are associated with chemical exchange or saturation with many parameters that cause the dictionary to grow exponentially. The computing system advantageously uses neural networks (e.g. neural networks 120) to reconstruct or generate the image of the tissue sample from each of the magnetized or excited slices. In some implementations, the computing system can maintain or train a neural network for each respective slice. For example, the computing system can generate or reconstruct the image of the tissue sample by applying a first neural network to the first set of magnetized slices and a second neural network to the second set of magnetized slices. In some implementations, the computing system can maintain or train a neural network for all of the slices. For example, the computing system can generate or reconstruct the image of the tissue sample by applying a neural network to the first set of magnetized slices and the second set of magnetized slices.

Now referring to FIG. 3 in conjunction with FIG. 6, FIG. 3 depicts an illustration of numerical simulations of the msCEST-MRF accuracy. The computing system can use a customized volumetric brain phantom to simulate an msCEST-MRF acquisition. The same anatomical slice can be used to simulate the acquisition of all slices to eliminate any confounds due to the anatomy. The computing system can quantify the tissue parameters in each slice with a trained neural network corresponding to each respective slice. The computing system can compare the output to ground-truth values.

The computing system can use or train the neural networks to reconstruct the images. The neural networks may be an instance of the architecture detailed herein in conjunction with Section B. The configuration of the neural networks may be in accordance with a generative adversarial network (GAN), a variational auto-encoder, or other unsupervised or semi-supervised model, among others. Each of the neural networks can have at least one input and at least one output. The input to the neural networks may correspond to the inputs of the computing system. The input to the neural networks (or corresponding random noise distribution vectors) can be processed one-by-one by the computing system.

The computing system can generate the images by obtaining the tissue parameters of each of the slices. The computing system can train a neural network for each individual slice. For example, each neural network can be associated with each slice that has a different signal evolution. The computing system can train the neural network on a dataset customized for each slice. The computing system can advantageously include the plurality of neural networks for training from each individual slice.

The input of the neural networks can include the training dataset (e.g., training dataset 124). The training dataset may be generated using a pseudo-random number generator. The computing system can define a training dataset for each sequence of slices. For example, the computing system can identify a unique sequence of slices for each slice to define a training dataset for each slice. The computing system can use each training dataset to train a respective neural network for reconstructing a respective slice.

The output of the neural networks can include the images (or test images or feature space representations) corresponding to the input. The output of one neural network may be fed into the input of another neural network. The output can include a resultant. The input and the output may be related to each other via a set of weights (sometimes referred herein as parameters, kernel parameters, or neural parameters) to be applied to the input to generate the output. In some embodiments, the set of weights may be arranged in one or more transform layers. Each layer may specify a combination or a sequence of application of the weights. The layers may be arranged in accordance with the machine learning algorithm or model for the neural networks.

The model can use the plurality of neural networks to map and obtain a plurality of parameters for multiple slices at the same time. The model can combine deep learning reconstruction to use the plurality of neural networks. Without the plurality of neural networks, the scan length would increase as the number of slices increased. Based on the plurality of parameters, the model can reconstruct or generate the underlying tissue parameters from all the slices. By using the plurality of neural networks, the model can reconstruct the tissue parameters to increase spatial coverage without increasing scan length. The computing system advantageously uses the neural networks such that the reconstruction is instantaneous subsequent to training the network and requires few computational resources. For example, the computing system in its entirety can be incorporated into an MRI scanner and reconstruct the images on the scanner obtaining the slices.

The computing system can provide the images via the output (e.g., output 128) to a requesting device (e.g., the imaging device 104) for presentation on a display (e.g., via the display 130). The computing system can send, transmit, or provide at least one output for presentation to the display. The output may include the selected images. The display may be part of the image retrieval system 112 or on another computing device that may be communicatively coupled to the image retrieval system 112. The display 130 may present or render the output 128 upon receipt. For example, the display 130 may render a graphical user interface that shows the selected images 126.

Now referring to FIGS. 4A and 4B in conjunction with FIG. 6, FIGS. 4A and 4B depicts a characterization of the resulting error for a slice ordering. In particular, FIGS. 4A and 4B depicts a normalized root-mean-square error (NRMSE) of each tissue parameter on a log scale. FIG. 4A depicts NRMSE of each parameter for a single slice with varying levels of injected Gaussian white noise. FIG. 4B depicts NRMSE of each parameter for all 14 slices. The dashed colored lines indicate the NRMSE of each tissue parameter for an equivalent single slice CEST-MRF sequence. For some parameters and slices, the msCEST-MRF error was below that of the single slice CEST-MRF despite the 14-fold larger spatial coverage. By modifying the sequences of the slices based on the metrics, the computing system can reduce the error.

Now referring to FIG. 5 in conjunction with FIG. 6, FIG. 5 depicts an example vivo acquisition of 14 slices. In particular, FIG. 5 depicts a subset of reconstructed tissue parameters from an in vivo healthy subject imaged with the msCEST-MRF pulse sequence. The total scan time to acquire all 14 slices was 105 seconds, same as a single-slice sequence but with a wider spatial coverage. Although T1w and T2w were underestimated, the remaining CEST parameters were within the expected ranges. FIG. 5 demonstrates that the computing system can successfully acquire data from the sequence of the plurality of slices and reconstruct it into images.

B. Fast CEST MR Fingerprinting with Increased Volumetric Coverage Using Deep Learning Reconstruction Brain Metastases (BM) often presents as multiple lesions in different brain regions so whole brain coverage of CEST-MRF is important. The acquisition time of conventional CEST increases linearly with the number of slices although CEST-MRF is inherently faster than conventional CEST methods. The present disclosure includes an innovative acquisition scheme to enable whole head coverage without increasing scan time. Instead of acquiring the same slice after each saturation pulse train, the CEST-MRF sequence is modified to sequentially acquire multiple slices by using a variable slice ordering that is permuted for each step of the schedule. Permuting the slice ordering varies the saturation sampled by each slice given the dependence of the CEST saturation on the T1 relaxation. The tissues in each slice undergoes a magnetization or excitation that is unique to that slice based on the proximity to the saturation pulse, which enhances the discrimination between different tissue types and facilitates accurate reconstruction. The total scan time remains unchanged because the additional slices are acquired within the unused “dead-time” of the sequence. The temporal order of the slices can be a simple heuristic function (e.g., “skip-2”) or optimized to maximize the discrimination in each slice. For reconstruction, a neural network can be trained for each slice or for all slices simultaneously.

The present disclosure discusses custom multi-slice ordering for rapid volumetric head coverage. The pulse sequence can be modified to acquire multiple slices following each saturation pulse. In a particular non-limiting example, imaging is conducted by a 3T GE Signa Premier scanner using a 48-channel head coil. An acceleration factor of R=3 with partial Fourier can be used to enable a spatial resolution of $1.2\times1.2\times3$ mm$^3$ to ensure that small lesions can be resolved. These acquisition parameters require approximately 40 slices for whole brain coverage with the EPI readout. A simultaneous multi-slice acceleration factor of S=2 can be used to both reduce scan time and facilitate the slice ordering optimization as previously described. The slice order for each group of 20 slices can be optimized to maximize the tissue discriminability in each slice using dynamic hill climbing algorithms.

CEST imaging is a promising tool for diagnosis and evaluation of treatment response in tumors. However, conventional CEST is not quantitative and requires long acquisition times. CEST MR fingerprinting (CEST-MRF can suffer from limited volumetric coverage. The present disclosure includes a novel multi-slice CEST-MRF pulse sequence and deep learning reconstruction method to enable volumetric coverage without the need for additional scan time. Numerical simulations and in vivo experiments in a healthy subject can be performed to demonstrate feasibility and utility of the proposed multi-slice CEST-MRF technique.

Interest in Chemical Exchange Saturation Transfer (CEST) imaging for cancer can differentiate true progression from pseudo-progression in brain tumors. CEST can suffer from a qualitative signal, long scan times, and complicated analysis that is difficult for clinical adoption. CEST can be combined with MR fingerprinting (CEST-MRF) to yield rapid and quantitative exchange rates and volume fractions maps. In pre-clinical and clinical systems, CEST-MRF can experience reduced volumetric coverage. The present disclosure demonstrates a proof-of-concept for a rapid multi-slice CEST-MRF (msCEST-MRF) pulse sequence and reconstruction method for whole head coverage with short scan time (e.g., <2 minutes). The accuracy of the msCEST-MRF approach is evaluated with numerical simulations and its utility in vivo is demonstrated in a healthy human subject.

An example pulse sequence diagram is shown in FIG. 2. A Gaussian-shaped saturation pulse train centered on the amide proton frequency (3.5 ppm) was used. The saturation power was varied according to a previously described schedule. A set of N=14 slices were excited after the saturation pulse in each time point. Because the saturated magnetization undergoes T1 relaxation, later slices can experience decayed magnetization and weaker signal. The slice excitation order was therefore varied for each schedule time point. Here, a simple ‘skip-3’ circular shift ordering was used. The repetition time (TR), excitation flip angle (FA) and saturation duration (Tsat) were as follows: TR=3500 ms, FA=90°, Tsat=2560 ms. The signal from each slice was read with an EPI readout with partial Fourier factor of −6/8, acceleration factor R=2 and an echo time (TE) of 24 ms. The matrix size was 224×224 with a FOV of 280 mm2 for an in plane resolution of 1.25 mm2 and a slice thickness of 5 mm. The acquisition of each slice required-64 ms and the total acquisition time for the 30 schedule time steps used was 105 seconds.

The tissue parameters were quantified with a 4-layer neural network implemented in Pytorch. Since the signal from each slice undergoes a unique evolution based on its slice ordering, the data from each slice was reconstructed with a separately trained network. The training dataset consisted of 400,000 entries sampled from the ranges shown in Table 1:

TABLE 1

| Parameter Name | Symbol | Range |
|---|---|---|
| Water T1 | T1w (ms) | 1-3000 |
| WaterT2 | T2w (ms) | 1-2000 |
| Amide Exchange Rate | ksw (Hz) | 1-100 |
| Semi-solid Exchange Rate | kssw (Hz) | 0-100 |
| Amide Volume Fraction | fs (%) | 0-0.91 |

TABLE 1-continued

| Parameter Name | Symbol | Range |
|---|---|---|
| Semi-solid Volume Fraction | fss (%) | 0-14 |
| B1 | B1 (a.u.) | 0-2 |

The accuracy of the reconstructed parameter maps was assessed in a modified Brainweb-based digital phantom (FIG. 3). An msCEST-MRF acquisition was simulated with the digital phantom and the normalized root-mean-square error (NRMSE) calculated. The same anatomical slice was used to simulate all slice orderings to eliminate confounds due to the different anatomy. White Gaussian noise was added to the data to obtain a range of signal-to-noise ratios (SNR) and the error calculated for each SNR. The msCEST-MRF error was compared to that of the single-slice CEST-MRF sequence acquired with the same acquisition parameters.

A healthy, 31 years old female volunteer was recruited and gave informed consent in accordance with the institution IRB protocol. The subject was scanned with msCEST-MRF on a Signa Premier 3T scanner (GE Healthcare, Waukesha, WI) with a 48-channel head receiver coil. Raw data were extracted and reconstructed as described above.

The NRMSEs for a single slice for a range of SNRs is shown in FIG. 4A and that of all slices in FIG. 4B in comparison to the single-slice error. The in vivo maps from the healthy volunteer for a subset of slices are shown in FIG. 5. The CEST parameters were within the expected ranges.

This present disclosure demonstrates a novel volumetric CEST-MRF approach at no additional scan time. Several improvements can be made to the method to reduce the error and improve the spatial coverage. First, the slice ordering can be optimized. Optimizing the slice ordering and/or the acquisition schedule can reduce the error and a synergistic optimization of both may significantly improve tissue discrimination. Optimization over the space of permutations (orderings) is a difficult problem and finding a global optimum is impractical for all but a small number of slices. Nevertheless, various heuristics can be used to find a local minimum and reduce the error. Second, combining the pulse sequence with simultaneous multi-slice can multiply the spatial coverage and facilitate the slice ordering optimization while eliminating the need for training additional neural networks. Finally, the spatial coverage can also be increased by interleaving more slices in each TR at the cost of a modest (–30 seconds) increase in the total scan time. An important consideration for CEST-MRF imaging over a large volume is potential BO and B1 in homogeneities. This can be addressed with additional BO and B1 scans or by inclusion of these parameters in the neural training dataset, as was done with B1 in this work, at the cost of increased training complexity.

C. Computing and Network Environment

Figure 7:
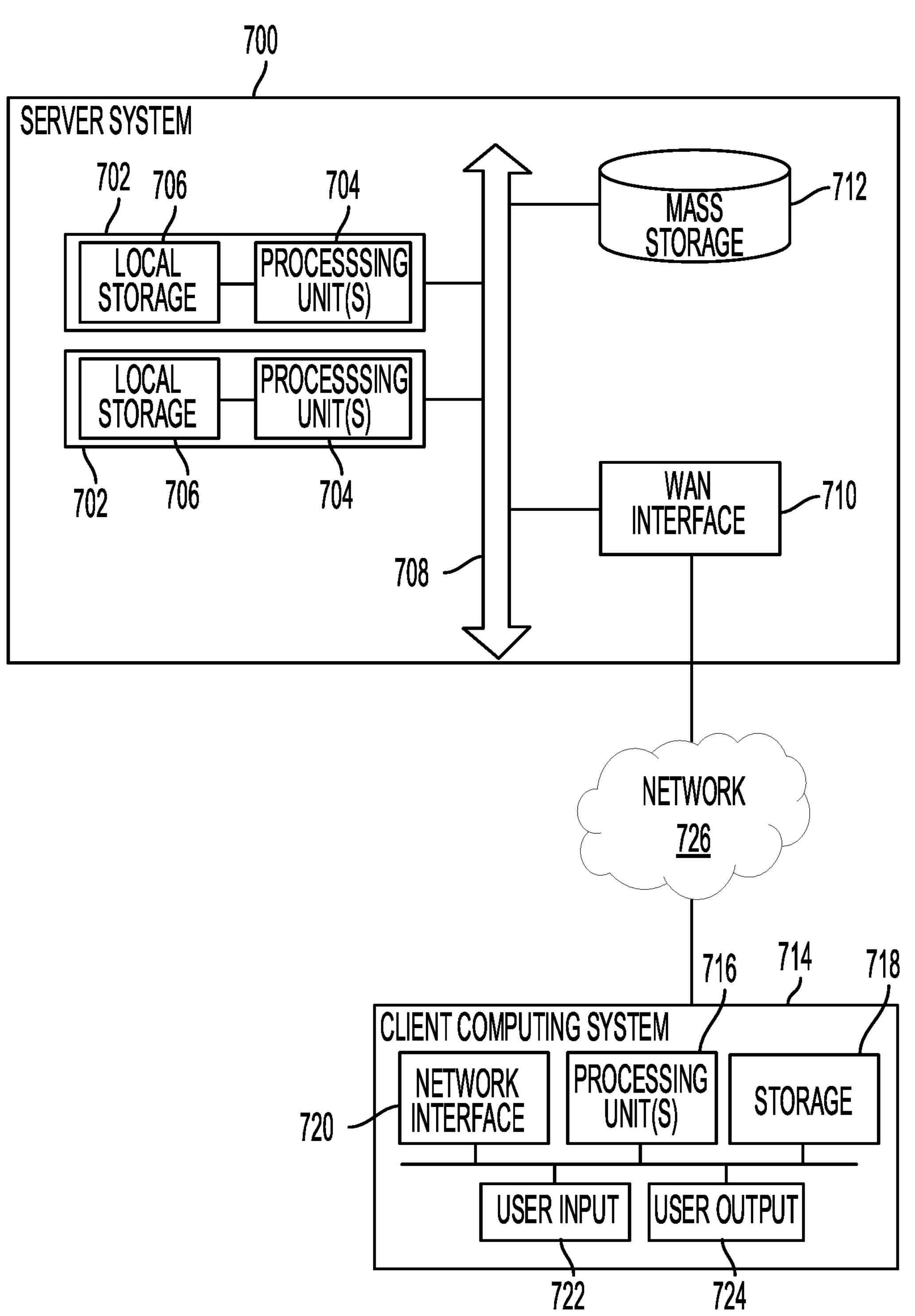
FIG. 7 depicts a block diagram of a server system and a client computer system in accordance with an illustrative embodiment.

Various operations described herein can be implemented on computer systems. FIG. 7 shows a simplified block diagram of a representative server system 700, client computer system 714, and network 726 usable to implement certain embodiments of the present disclosure. In various embodiments, server system 700 or similar systems can implement services or servers described herein or portions thereof. Client computer system 714 or similar systems can implement clients described herein. The system 100 described herein can be similar to the server system 700. Server system 700 can have a modular design that incorporates a number of modules 702 (e.g., blades in a blade server embodiment); while two modules 702 are shown, any number can be provided. Each module 702 can include processing unit(s) 704 and local storage 706.

Processing unit(s) 704 can include a single processor, which can have one or more cores, or multiple processors. In some embodiments, processing unit(s) 704 can include a general-purpose primary processor as well as one or more special-purpose co-processors such as graphics processors, digital signal processors, or the like. In some embodiments, some or all processing units 704 can be implemented using customized circuits, such as application specific integrated circuits (ASICs) or field programmable gate arrays (FPGAs). In some embodiments, such integrated circuits execute instructions that are stored on the circuit itself. In other embodiments, processing unit(s) 704 can execute instructions stored in local storage 706. Any type of processors in any combination can be included in processing unit(s) 704.

Local storage 706 can include volatile storage media (e.g., DRAM, SRAM, SDRAM, or the like) and/or non-volatile storage media (e.g., magnetic or optical disk, flash memory, or the like). Storage media incorporated in local storage 706 can be fixed, removable or upgradeable as desired. Local storage 706 can be physically or logically divided into various subunits such as a system memory, a read-only memory (ROM), and a permanent storage device. The system memory can be a read-and-write memory device or a volatile read-and-write memory, such as dynamic random-access memory. The system memory can store some or all of the instructions and data that processing unit(s) 704 need at runtime. The ROM can store static data and instructions that are needed by processing unit(s) 704. The permanent storage device can be a non-volatile read-and-write memory device that can store instructions and data even when module 702 is powered down. The term "storage medium" as used herein includes any medium in which data can be stored indefinitely (subject to overwriting, electrical disturbance, power loss, or the like) and does not include carrier waves and transitory electronic signals propagating wirelessly or over wired connections.

In some embodiments, local storage 706 can store one or more software programs to be executed by processing unit(s) 704, such as an operating system and/or programs implementing various server functions such as functions of the system 100 of FIG. 1 or any other system described herein, or any other server(s) associated with system 100 or any other system described herein.

"Software" refers generally to sequences of instructions that, when executed by processing unit(s) 704 cause server system 700 (or portions thereof) to perform various operations, thus defining one or more specific machine embodiments that execute and perform the operations of the software programs. The instructions can be stored as firmware residing in read-only memory and/or program code stored in non-volatile storage media that can be read into volatile working memory for execution by processing unit(s) 704. Software can be implemented as a single program or a collection of separate programs or program modules that interact as desired. From local storage 706 (or non-local storage described below), processing unit(s) 704 can retrieve program instructions to execute and data to process in order to execute various operations described above.

In some server systems 700, multiple modules 702 can be interconnected via a bus or other interconnect 708, forming a local area network that supports communication between modules 702 and other components of server system 700.

Interconnect 708 can be implemented using various technologies including server racks, hubs, routers, etc.

A wide area network (WAN) interface 710 can provide data communication capability between the local area network (interconnect 708) and the network 726, such as the Internet. Technologies can be used, including wired (e.g., Ethernet, IEEE 1302.3 standards) and/or wireless technologies (e.g., Wi-Fi, IEEE 1302.11 standards).

In some embodiments, local storage 706 is intended to provide working memory for processing unit(s) 704, providing fast access to programs and/or data to be processed while reducing traffic on interconnect 708. Storage for larger quantities of data can be provided on the local area network by one or more mass storage subsystems 712 that can be connected to interconnect 708. Mass storage subsystem 712 can be based on magnetic, optical, semiconductor, or other data storage media. Direct attached storage, storage area networks, network-attached storage, and the like can be used. Any data stores or other collections of data described herein as being produced, consumed, or maintained by a service or server can be stored in mass storage subsystem 712. In some embodiments, additional data storage resources may be accessible via WAN interface 710 (potentially with increased latency).

Server system 700 can operate in response to requests received via WAN interface 710. For example, one of modules 702 can implement a supervisory function and assign discrete tasks to other modules 702 in response to received requests. Work allocation techniques can be used. As requests are processed, results can be returned to the requester via WAN interface 710. Such operation can generally be automated. Further, in some embodiments, WAN interface 710 can connect multiple server systems 700 to each other, providing scalable systems capable of managing high volumes of activity. Other techniques for managing server systems and server farms (collections of server systems that cooperate) can be used, including dynamic resource allocation and reallocation.

Server system 700 can interact with various user-owned or user-operated devices via a wide-area network such as the Internet. An example of a user-operated device is shown in FIG. 13 as client computing system 714. Client computing system 714 can be implemented, for example, as a consumer device such as a smartphone, other mobile phone, tablet computer, wearable computing device (e.g., smart watch, eyeglasses), desktop computer, laptop computer, and so on.

For example, client computing system 714 can communicate via WAN interface 710. Client computing system 714 can include computer components such as processing unit(s) 716, storage device 718, network interface 720, user input device 722, and user output device 724. Client computing system 714 can be a computing device implemented in a variety of form factors, such as a desktop computer, laptop computer, tablet computer, smartphone, other mobile computing device, wearable computing device, or the like.

Processor 716 and storage device 718 can be similar to processing unit(s) 704 and local storage 706 described above. Suitable devices can be selected based on the demands to be placed on client computing system 714; for example, client computing system 714 can be implemented as a "thin" client with limited processing capability or as a high-powered computing device. Client computing system 714 can be provisioned with program code executable by processing unit(s) 716 to enable various interactions with server system 700.

Network interface 720 can provide a connection to the network 726, such as a wide area network (e.g., the Internet) to which WAN interface 710 of server system 700 is also connected. In various embodiments, network interface 720 can include a wired interface (e.g., Ethernet) and/or a wireless interface implementing various RF data communication standards such as Wi-Fi, Bluetooth, or cellular data network standards (e.g., 3G, 4G, LTE, etc.).

User input device 722 can include any device (or devices) via which a user can provide signals to client computing system 714; client computing system 714 can interpret the signals as indicative of particular user requests or information. In various embodiments, user input device 722 can include any or all of a keyboard, touch pad, touch screen, mouse or other pointing device, scroll wheel, click wheel, dial, button, switch, keypad, microphone, and so on.

User output device 724 can include any device via which client computing system 714 can provide information to a user. For example, user output device 724 can include a display to display images generated by or delivered to client computing system 714. The display can incorporate various image generation technologies, e.g., a liquid crystal display (LCD), light-emitting diode (LED) including organic light-emitting diodes (OLED), projection system, cathode ray tube (CRT), or the like, together with supporting electronics (e.g., digital-to-analog or analog-to-digital converters, signal processors, or the like). Some embodiments can include a device such as a touchscreen that functions as both input and output device. In some embodiments, other user output devices 724 can be provided in addition to or instead of a display. Examples include indicator lights, speakers, tactile "display" devices, printers, and so on.

Some embodiments include electronic components, such as microprocessors, storage and memory that store computer program instructions in a computer readable storage medium. Many of the features described in this specification can be implemented as processes that are specified as a set of program instructions encoded on a computer readable storage medium. When these program instructions are executed by one or more processing units, they cause the processing unit(s) to perform various operations indicated in the program instructions. Examples of program instructions or computer code include machine code, such as is produced by a compiler, and files including higher-level code that are executed by a computer, an electronic component, or a microprocessor using an interpreter. Through suitable programming, processing unit(s) 704 and 716 can provide various functionality for server system 700 and client computing system 714, including any of the functionality described herein as being performed by a server or client, or other functionality.

It will be appreciated that server system 700 and client computing system 714 are illustrative and that variations and modifications are possible. Computer systems used in connection with embodiments of the present disclosure can have other capabilities not specifically described here. Further, while server system 700 and client computing system 714 are described with reference to particular blocks, it is to be understood that these blocks are defined for convenience of description and are not intended to imply a particular physical arrangement of component parts. For instance, different blocks can be but need not be located in the same facility, in the same server rack, or on the same motherboard. Further, the blocks need not correspond to physically distinct components. Blocks can be configured to perform various operations, e.g., by programming a processor or providing appropriate control circuitry, and various blocks might or might not be reconfigurable depending on how the initial configuration is obtained. Embodiments of the present disclosure can be realized in a variety of apparatus including electronic devices implemented using any combination of circuitry and software.

While the disclosure has been described with respect to specific embodiments, one skilled in the art will recognize that numerous modifications are possible. Embodiments of the disclosure can be realized using a variety of computer systems and communication technologies including but not limited to specific examples described herein. Embodiments of the present disclosure can be realized using any combination of dedicated components and/or programmable processors and/or other programmable devices. The various processes described herein can be implemented on the same processor or different processors in any combination. Where components are described as being configured to perform certain operations, such configuration can be accomplished, e.g., by designing electronic circuits to perform the operation, by programming programmable electronic circuits (such as microprocessors) to perform the operation, or any combination thereof. Further, while the embodiments described above may make reference to specific hardware and software components, those skilled in the art will appreciate that different combinations of hardware and/or software components may also be used and that particular operations described as being implemented in hardware might also be implemented in software or vice versa.

Computer programs incorporating various features of the present disclosure may be encoded and stored on various computer readable storage media; suitable media include magnetic disk or tape, optical storage media such as compact disk (CD) or DVD (digital versatile disk), flash memory, and other non-transitory media. Computer readable media encoded with the program code may be packaged with a compatible electronic device, or the program code may be provided separately from electronic devices (e.g., via Internet download or as a separately packaged computer-readable storage medium).

Thus, although the disclosure has been described with respect to specific embodiments, it will be appreciated that the disclosure is intended to cover all modifications and equivalents within the scope of the following claims.

What is claimed is:

1. A method, comprising:

generating, by a computing system, a first sequence of a plurality of slices of a tissue sample;

applying, by the computing system, a pulse of radio frequency energy to the first sequence of the plurality of slices to generate a first set of magnetized slices;

generating, by the computing system, a second sequence of the plurality of slices;

applying, by the computing system, the pulse of radio frequency energy to the second sequence of the plurality of slices to generate a second set of magnetized slices; and generating, by the computing system, an image of the tissue sample by applying a first neural network to the first set of magnetized slices and a second neural network to the second set of magnetized slices.

2. The method of claim 1, further comprising generating, by the computing system, the second sequence of the plurality of slices by shifting a position of each slice in the first sequence of the plurality of slices by a predetermined amount.

3. The method of claim 1, further comprising:

generating, by the computing system, a comparison between the image of the tissue sample and a predetermined ground-truth value; and identifying, by the computing system, an error of the image based on the comparison.

4. The method of claim 3, further comprising generating, by the computing system, the second sequence of the plurality of slices by modifying the first sequence of the plurality of slices based on the error.

5. The method of claim 1, further comprising:

receiving, by the computing system, the plurality of slices of the tissue sample from a histopathological image preparer or an imaging device; and storing, by the computing system, in a database, the plurality of slices of the tissue sample.

6. The method of claim 1, further comprising:

modifying, by the computing system, the radio frequency energy provided by the pulse; and applying, by the computing system, the modified pulse to the second sequence of the plurality of slices to generate the second set of magnetized slices having a first magnetization different than a second magnetization of the first set of magnetized slices.

7. The method of claim 1, further comprising applying, by the computing system, the pulse to the second sequence of the plurality of slices at a predetermined time subsequent to applying the pulse to the first sequence of the plurality of slices to generate the second set of magnetized slices having a first magnetization different than a second magnetization of the first set of magnetized slices.

8. The method of claim 7, further comprising maintaining, by the computing system, an acquisition schedule defining the predetermined time for obtaining subsequent sequences of the plurality of slices.

9. The method of claim 1, further comprising:

maintaining, by the computing system, the first neural network for the first set of magnetized slices by training the first neural network for the first set of magnetized slices; and maintaining, by the computing system, the second neural network for the second set of magnetized slices by training the second neural network for the second set of magnetized slices.

10. The method of claim 1, further comprising storing, by the computing system, the image of the tissue sample in a database.

11. A system, comprising:

a computing system having one or more processors coupled with memory, the computing system configured to:

generate a first sequence of a plurality of slices of a tissue sample;

apply a pulse of radio frequency energy to the first sequence of the plurality of slices to generate a first set of magnetized slices;

generate a second sequence of the plurality of slices;

apply the pulse of radio frequency energy to the second sequence of the plurality of slices to generate a second set of magnetized slices; and generate an image of the tissue sample by applying a first neural network to the first set of magnetized slices and a second neural network to the second set of magnetized slices.

12. The system of claim 11, wherein the computing system is further configured to generate the second sequence of the plurality of slices by shifting a position of each slice in the first sequence of the plurality of slices by a predetermined amount.

13. The system of claim 11, wherein the computing system is further configured to:

generate a comparison between the image of the tissue sample and a predetermined ground-truth value; and identifying, by the computing system, an error of the image based on the comparison.

14. The system of claim 13, wherein the computing system is further configured to generate the second sequence of the plurality of slices by modifying the first sequence of the plurality of slices based on the error.

15. The system of claim 11, wherein the computing system is further configured to:

receive, the plurality of slices of the tissue sample from a histopathological image preparer or an imaging device; and store, in a database, the plurality of slices of the tissue sample.

16. The system of claim 11, wherein the computing system is further configured to:

modify the radio frequency energy provided by the pulse; and apply the modified pulse to the second sequence of the plurality of slices to generate the second set of magnetized slices having a first magnetization different than a second magnetization of the first set of magnetized slices.

17. The system of claim 11, wherein the computing system is further configured to apply the pulse to the second sequence of the plurality of slices at a predetermined time subsequent to applying the pulse to the first sequence of the plurality of slices to generate the second set of magnetized slices having a first magnetization different than a second magnetization of the first set of magnetized slices.

18. The system of claim 17, wherein the computing system is further configured to maintain an acquisition schedule defining the predetermined time for obtaining subsequent sequences of the plurality of slices.

19. The system of claim 11, wherein the computing system is further configured to:

maintain the first neural network for the first set of magnetized slices by training the first neural network for the first set of magnetized slices; and maintain the second neural network for the second set of magnetized slices by training the second neural network for the second set of magnetized slices.

20. The system of claim 11, wherein the computing system is further configured to store the image of the tissue sample in a database.

* * * * *